United States Patent
Matsushita et al.

(10) Patent No.: US 6,382,394 B1
(45) Date of Patent: May 7, 2002

(54) PARTS FRONT AND BACK FACE ALIGNING APPARATUS FOR VIBRATORY PARTS FEEDING MACHINE

(75) Inventors: Shigeki Matsushita; Kenji Enami; Toshio Ogusu, all of Shizuoka-ken (JP)

(73) Assignee: NTN Corporation, Osaka-fu (JP)

( * ) Notice: Subject to any disclaimer, the term of this patent is extended or adjusted under 35 U.S.C. 154(b) by 0 days.

(21) Appl. No.: 09/437,755

(22) Filed: Nov. 10, 1999

(30) Foreign Application Priority Data

Nov. 26, 1998 (JP) ............................................. 10-335984

(51) Int. Cl.$^7$ ............................................. B65G 43/08
(52) U.S. Cl. ........................................ 198/395; 198/401
(58) Field of Search ................................. 198/401, 395

(56) References Cited

U.S. PATENT DOCUMENTS

| | | | | |
|---|---|---|---|---|
| 4,149,621 A | * | 4/1979 | Sollenberger et al. | 198/395 |
| 4,619,356 A | * | 10/1986 | Dean et al. | 198/395 |
| 4,669,599 A | * | 6/1987 | Dijkmeijer | 198/394 |
| 4,744,458 A | * | 5/1988 | Fluck et al. | 198/460 |
| 4,801,043 A | * | 1/1989 | Cindric | 221/1 |
| 4,874,080 A | * | 10/1989 | Wroblewski | 198/463.6 |
| 4,960,360 A | * | 10/1990 | Giannuzzi et al. | 414/755 |
| 5,314,055 A | * | 5/1994 | Gordon | 198/395 |
| 5,924,546 A | * | 7/1999 | Funaya | 198/395 |
| 5,955,740 A | * | 9/1999 | Yokajty et al. | 250/559.08 |
| 6,014,817 A | * | 1/2000 | Thompson et al. | 34/60 |
| 6,046,462 A | * | 4/2000 | Yokajty et al. | 250/559.08 |
| 6,059,117 A | * | 5/2000 | Novak et al. | 209/10 |
| 6,112,903 A | * | 9/2000 | Kimmel et al. | 209/11 |
| 6,119,849 A | * | 9/2000 | Svejkovsky et al. | 198/860.4 |

\* cited by examiner

*Primary Examiner*—Christopher P. Ellis
*Assistant Examiner*—Rashmi Sharma
(74) *Attorney, Agent, or Firm*—Arent Fox Kintner Plotkin & Kahn, PLLC

(57) ABSTRACT

A parts aligning apparatus that has a plurality of parts carried on a track located upstream of the apparatus. A first track of the apparatus carries the parts thereon. When a sensing device senses a particular face of each part is contacting the first track, an air jet device emits a burst of compressed air, causing the part on the first track to turn over onto a second track so that the particular face faces upward, or away from the track surface. During this process, the part turns around a common apex between the first and second tracks, which serves as a support point.

16 Claims, 18 Drawing Sheets

F I G. 6
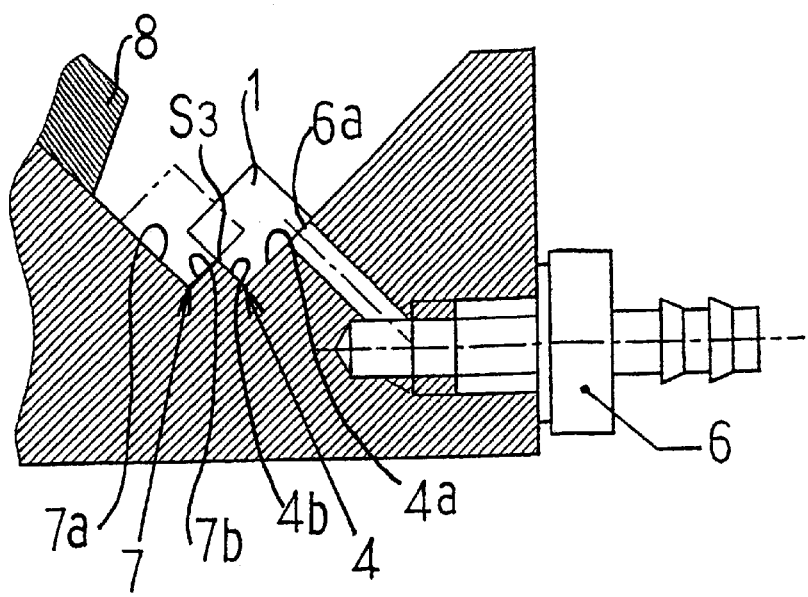
F I G. 7
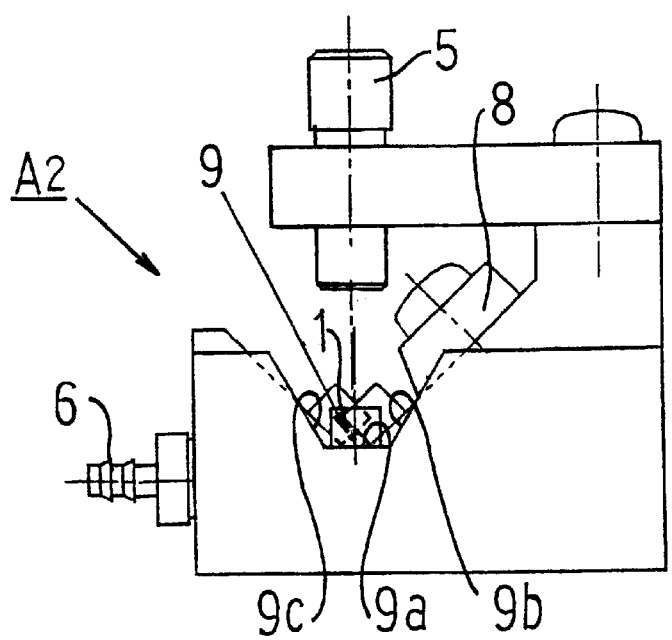

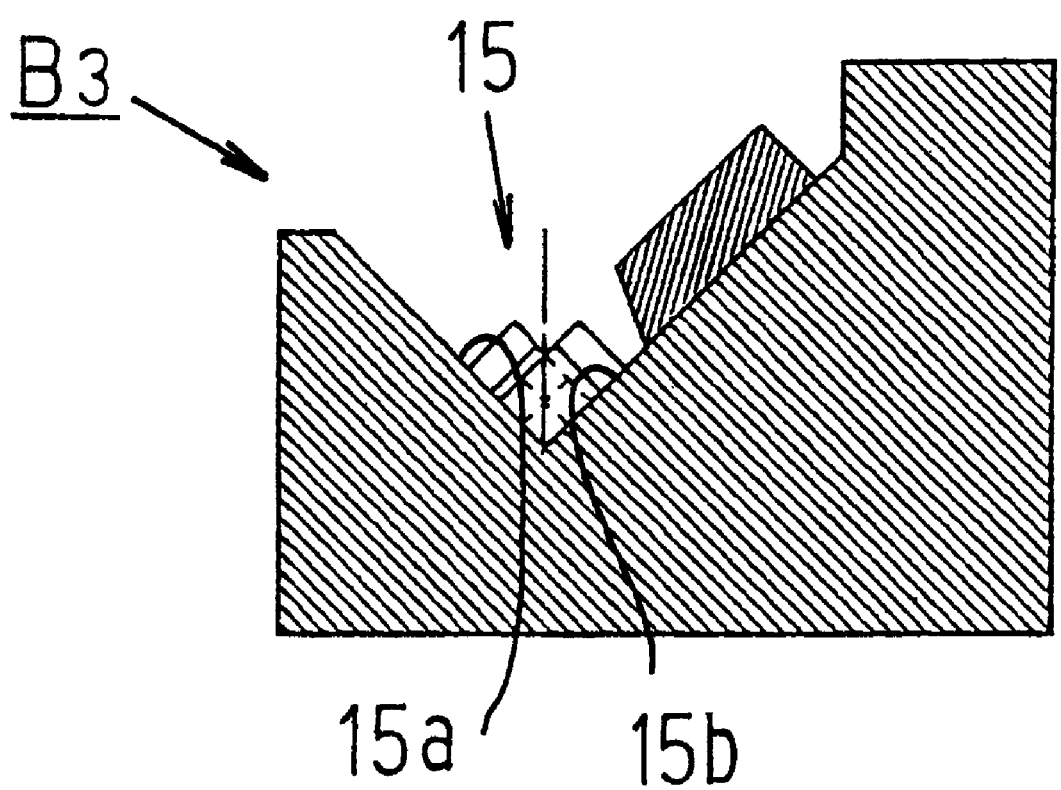
F I G. 23

PARTS FRONT AND BACK FACE ALIGNING APPARATUS FOR VIBRATORY PARTS FEEDING MACHINE

BACKGROUND OF THE INVENTION

The present invention relates to a vibratory parts feeding machine capable of automatically feeding discrete chip electronic parts or other parts efficiently and continuously at a high speed.

While the vibratory parts feeding machine is widely used for automatically aligning and feeding discrete chip electronic parts such as chip resistors and chip capacitors, some parts need to be aligned not only in the orientation with respect to the shape but also in up/down direction of the face. For example, a part 1 (chip resistor) shown in FIG. 29 is a white ceramic substrate of rectangular shape having an electrode provided on either end in the longitudinal direction and a black resistor element formed on one of the faces (the face on which the resistor element is formed will be called the front face 1$a$, and the opposite face the back face 1$b$ hereafter). Longitudinal dimension L, transverse dimension (width) D, vertical dimension (thickness) T, and ratios of these dimensions of the part 1 vary for different identification codes of the part. There are parts of diverse ranges of dimensions and shapes, for example, from sheet-like parts having large width to thickness (D/T) ratios to block-like parts having small width to thickness (D/T) ratios. As a parts front and back face aligning apparatus used in aligning such parts 1 in the up/down facing orientation, a configuration disclosed in Japanese Examined Patent Publication No.H1-34894, for example, is known.

In the parts front and back face aligning apparatus disclosed in the patent publication mentioned above, sheet-shaped parts are guided successively onto one of inclined surfaces of a V-shaped track, and each part is checked by parts front/back face sensing means to see whether the part is facing up or down. When the part is found to be facing down, the part is immediately turned over to the other inclined surface of the V-shaped track by parts turn-over means, for example an air jet device.

Operations from the determination of up-down direction and turning over of the part 1 are carried out on the same V-shaped track 30 in the apparatus of the prior art described above, as shown in FIG. 30. As a result, a force to move the part 1 (horizontal movement a1, vertical movement b1 of the center of mass of the part 1) is required in addition to the force to turn the part 1 in the process of turning over the part 1. Also a point S1 around which the part 1 is turned over moves by sliding along the inclined surface of the V-shaped track 30 thus giving rise to a frictional force. As a consequence, the operation of turning over the part 1 tends to be unstable, which becomes more conspicuous as the width to thickness (D/T) ratio of the part 1 becomes smaller.

Specifically, when the width to thickness (D/T) ratio of the part 1 becomes smaller, horizontal movement of the center of mass of the part 1 decreases (a2) and the vertical movement increases (b2), as shown in FIG. 31, thus making it necessary to exert a force for flipping the part 1 more upward. In case the force to turn over the part is insufficient, the part 1 only momentarily lifts and returns to the former position without turning over. When the force to turn over the part is excessive, on the other hand, the part 1 may be scattered without turning over. Also when the width to thickness (D/T) ratio of the part 1 becomes smaller, sliding movement of a support point S2 around which the part 1 is turned over increases resulting in increasing factors of instability in the series of turning over actions, thus making one factor of decreasing the efficiency of turning over.

SUMMARY OF THE INVENTION

An object of the invention is to increase the efficiency of turning over parts and increase the efficiency of feeding the parts, while making it possible to accurately aligning and feeding more diversified parts.

In order to achieve the object described above, the present invention provides a parts front and back face aligning apparatus for a vibratory parts feeding machine that feeds parts while carrying the parts along a track by means of vibration and aligning the orientation of the parts, and has a part front/back orientation correcting section comprising a first track for carrying the parts that have been guided from a track in the upstream in single row and single layer, parts front/back face sensing means for determining whether the part being carried on the first track faces up or down, parts turn-over means that exerts a force to turn over the part located on the first track according to the decision of the parts front/back face sensing means, and a second track to which the part that has been turned over by the parts turn-over means is transferred and carried thereon.

With the configuration described above, the turn-over operation when the part is transferred from the first track to the second track can be carried out with the border between the tracks serving as the support point around which the part is turned. The support point around which the part is turned preferably remains fixed.

The first track in the parts front/back orientation correcting section may have such a configuration that has a first inclined wall whereon the parts are carried in an inclined attitude and a second inclined wall that is inclined in the opposite direction to the first inclined wall. The second track may have such a configuration that has a third inclined wall whereon the parts that have been transferred thereon from the first track are carried in an attitude inclined in the direction opposite to that of the first inclined wall and a fourth inclined wall that is inclined in the opposite direction to the third inclined wall. It is preferable that the second inclined wall of the first track and the fourth inclined wall of the second track share a common apex. In this case, the part is turned over on and around the apex that serves as a fixed support point. The apex is preferably located below a locus along which the center of mass of the part moves while the part is being turned over, in order to carry out the turn-over operation smoothly.

A junction may be provided downstream of the parts front/back orientation correcting means, in order to cause the parts carried on the first track and the parts carried on the second track to join in the same attitude at the junction. Further, a merging section may be provided between the parts front/back orientation correcting means and the junction, in order to merge the parts carried on the first track and the parts carried on the second track onto one track.

In case the parts need not to be aligned in the up-down facing orientation, or it is not necessary to align all parts in the up-down facing orientation for such a reason as the number of parts to be fed to the next process is small although the parts would be aligned in the up-down facing orientation or there is imbalance between the probabilities of the parts to face up and face down due to the characteristics of the parts, such a configuration may be employed as all parts on the first track are turned over by the parts turn-over means without checking the parts to see whether the part faces up or down. The parts turn-over device may be used as preprocessing means in the upstream of the parts front and back face aligning apparatus.

According to the present invention, the following effects can be obtained.

(1) Higher efficiency of turning over the parts and higher efficiency of feeding the parts than the configuration of the prior art can be achieved.

(2) Broader range of parts can be aligned and fed, because high efficiency of turning over can be achieved for rectangular parts of width to thickness ratios near 1 and round parts of height to diameter ratios near 1.

(3) Parts can be aligned continuously at a high speed because the parts are aligned while being carried.

BRIEF DESCRIPTION OF THE DRAWINGS

FIG. 6 is a sectional view showing the air jet device and surrounding thereof.

FIG. 7 shows the junction A2 viewed from the downstream.

FIG. 23 is a sectional view showing the merging section B3.

DETAILED DESCRIPTION OF THE PREFERRED EMBODIMENTS

Figure 29:
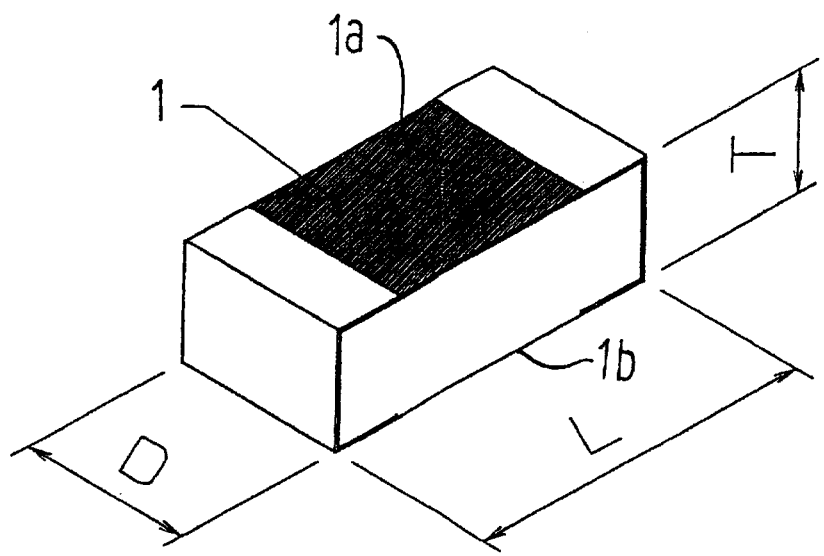
FIG. 29 is a perspective view showing the part used in the embodiment.
Figure 30:
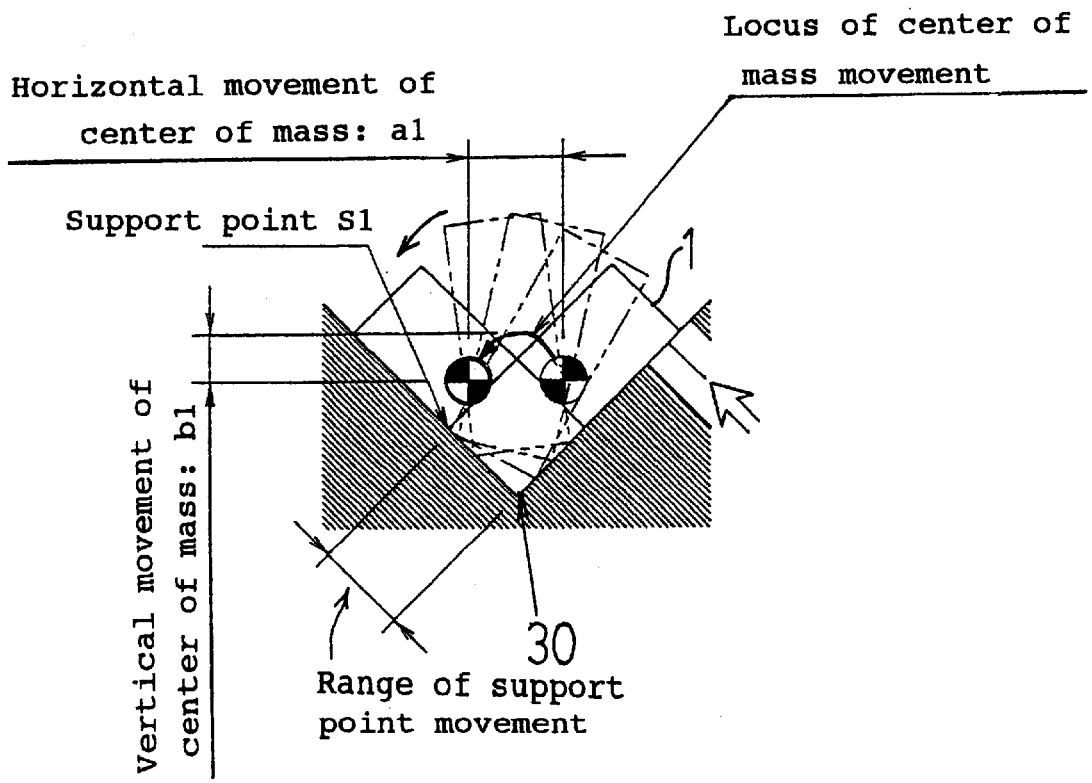
FIG. 30 is a sectional view showing the operation to turn over the part in the prior art apparatus.
Figure 31:
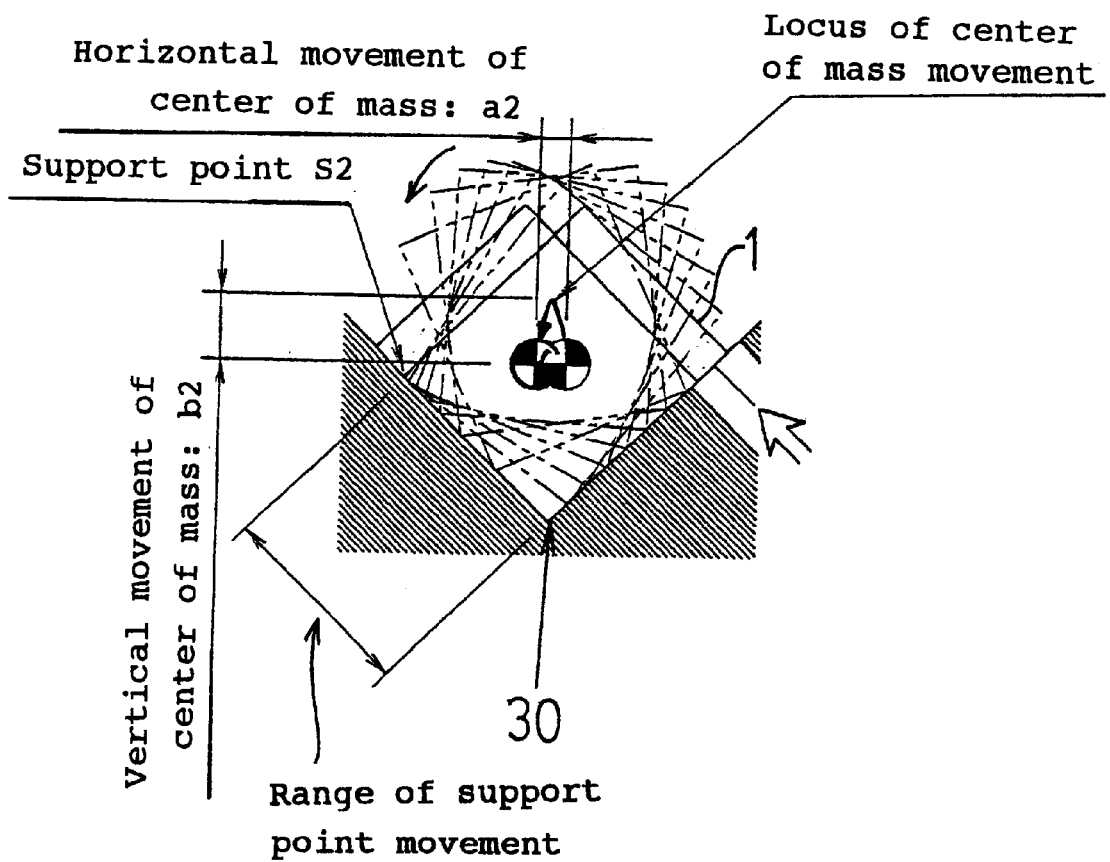
FIG. 31 is a sectional view showing the operation to turn over the part in the prior art apparatus.

Preferred embodiments of the present invention will be described below for a case where part 1 (chip resistor) shown in FIG. 29 is aligned and fed. As described previously, the part 1 is a white ceramic substrate of rectangular shape having an electrode provided on either end in the longitudinal direction and a black resistor element formed on one of the faces (the face on which the resistor element is formed will be called the front face 1a, and the opposite face the back face 1b hereafter). In the embodiment described below, parts having small width to thickness (D/T) ratios, for example in a range from 1.2 to 1.8, will be used. The parts 1 are automatically fed continuously at a high speed with the up/down orientation being aligned, by using the parts front and back face aligning apparatus according to the embodiment described below. The type, configuration and the way of feeding the parts are shown here by way of example, and should not be considered to restrict the present invention. For example, rectangular parts having a width to thickness (D/T) ratio of about 1 can also be automatically fed continuously at a high speed. Shape of the part is also not limited to rectangle, and disk-shaped parts and cylindrical parts can also be automatically fed continuously at a high speed.

Figure 1:
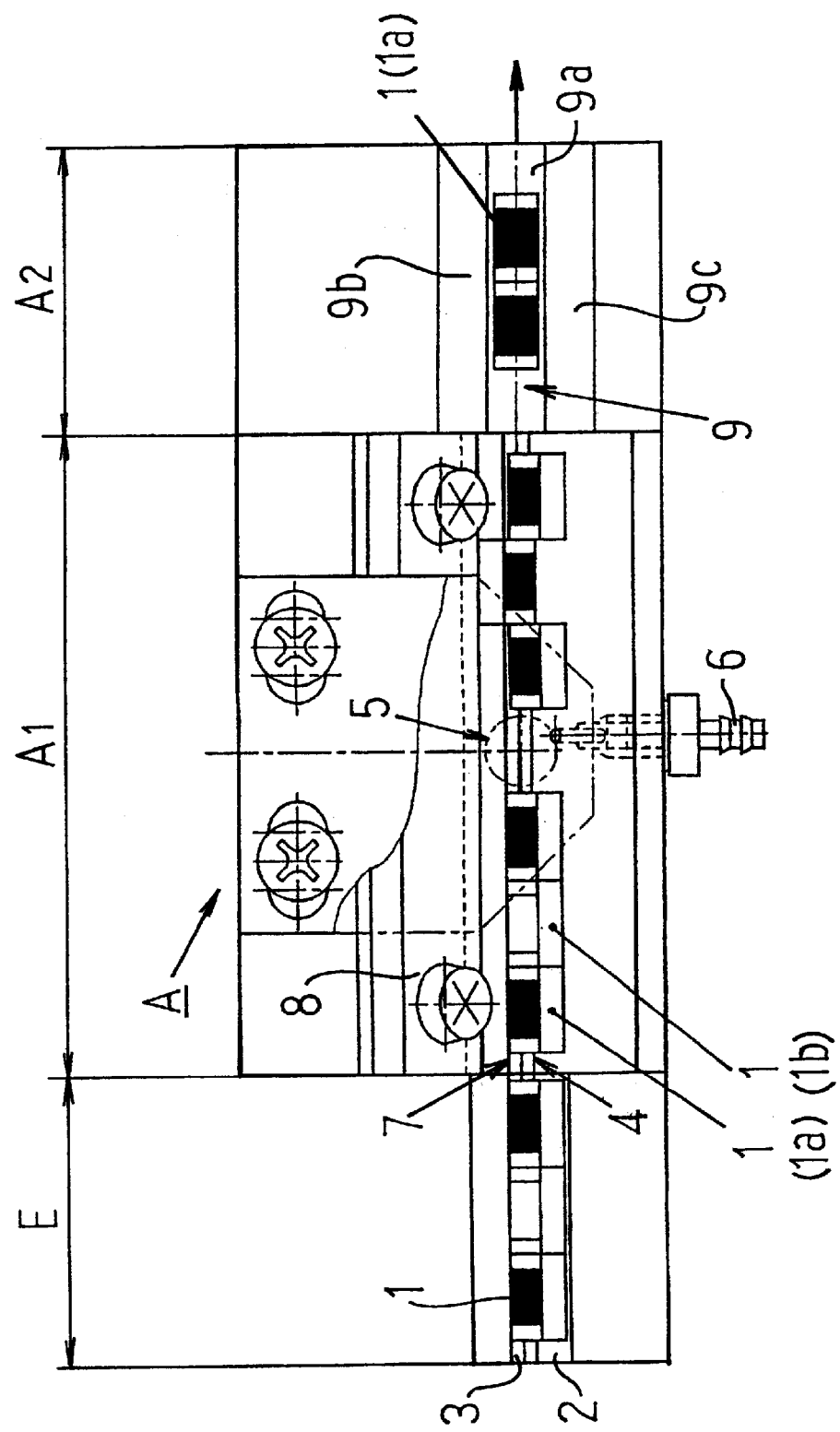
FIG. 1 is a plan view showing the overall configuration of the parts front and back face aligning apparatus A according to the first embodiment.
Figure 2:
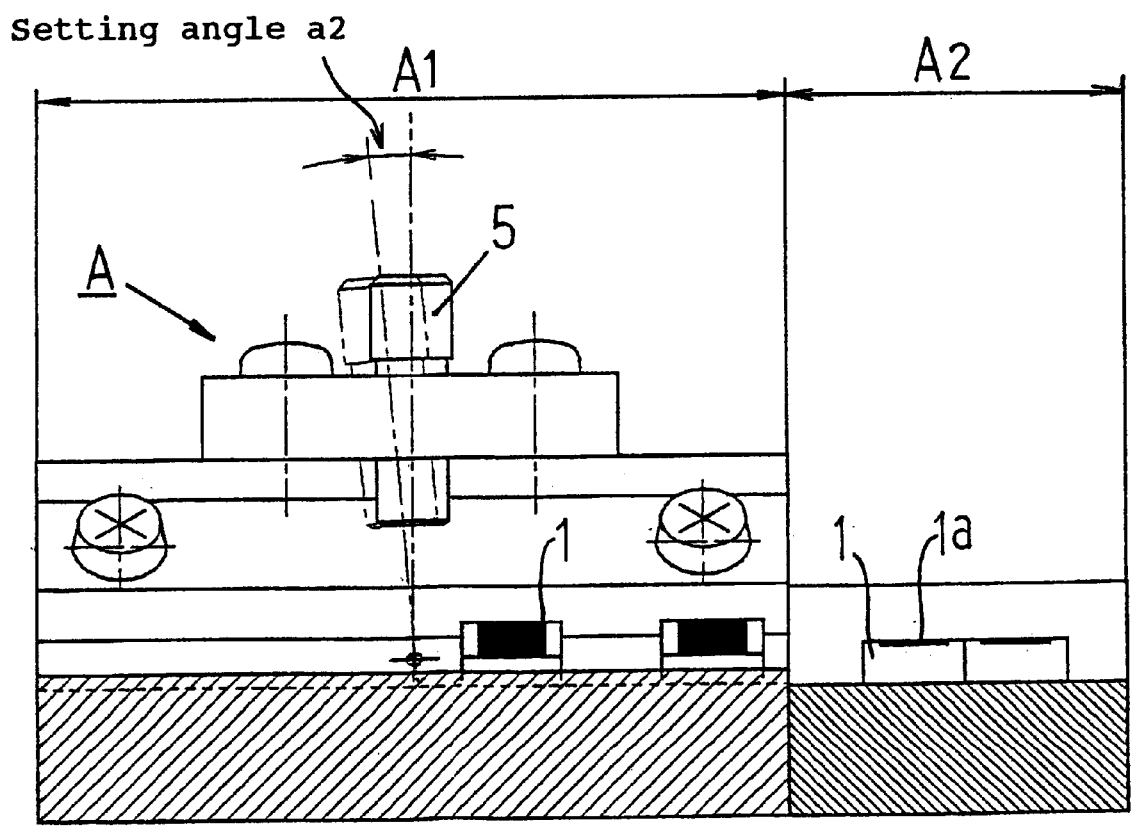
FIG. 2 is a side view (partially cut-away) showing the overall configuration of the parts front and back face aligning apparatus according to the first embodiment.

FIG. 1 and FIG. 2 show the overall configuration of the parts front and back face aligning apparatus A according to the first embodiment. The parts front and back face aligning apparatus A is disposed in a parts carrying path of a straight feeder or in a parts carrying path of a bowl feeder, and comprises a parts front/back orientation correcting section A1 located upstream and a junction A2 located downstream (the overall shape may be curved in an arc shape when disposed on a bowl feeder). Parts 1 are guided from the upstream track E into the parts front/back orientation correcting section A1 in a single row and single layer under the condition of being aligned in the longitudinal direction.

Figure 3:
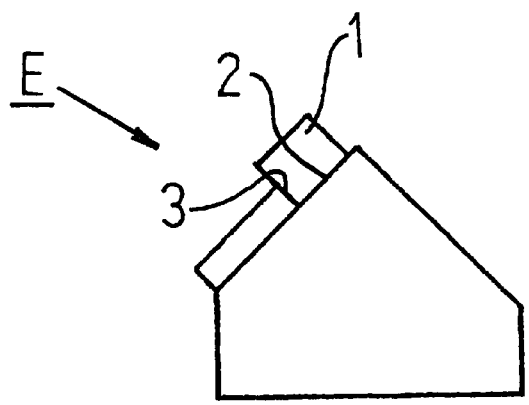
FIG. 3 shows the upstream track E viewed from the upstream.

Various known means may be employed for aligning the parts 1 in single row and in single layer in the longitudinal direction on the track. In this embodiment, such a configuration as shown in FIG. 3 is employed as the upstream track E has an inclined wall 2 of a width that corresponds to the width D of the part 1 and a cutout 3 having a height smaller than the thickness T of the part 1. The transversely oriented part 1 that has been carried with the longitudinal side (L) thereof being oriented at right angles to the moving direction falls off the inclined wall 2 to be rejected out of the track. The part 1 being carried on top of the other part in a stacked condition falls off the cutout 3 to be rejected out of the track.

Figure 4:
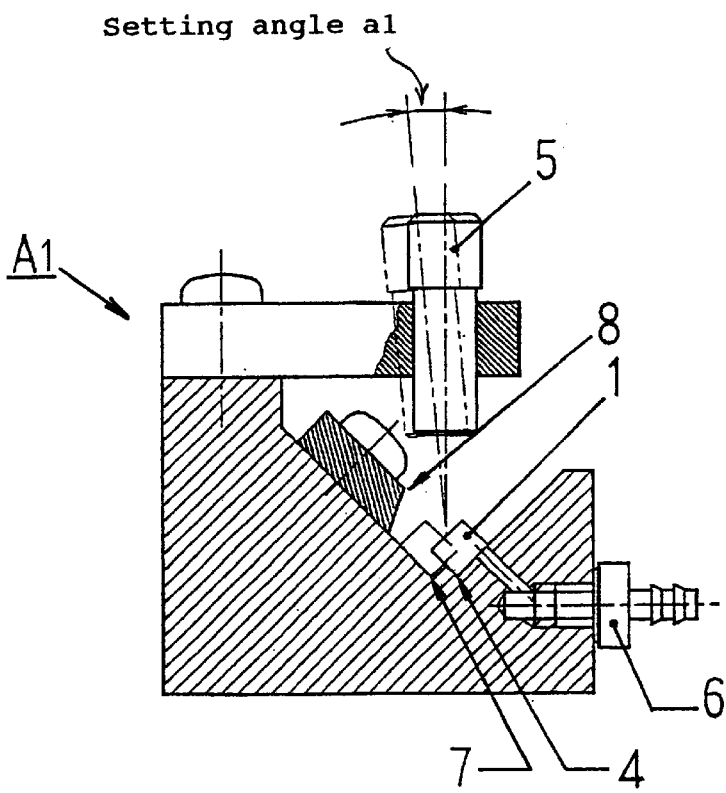
FIG. 4 is a sectional view showing the parts front/back orientation correcting section A1.

As shown in FIG. 4, the parts front/back orientation correcting section A1 has a first track 4 for carrying the parts 1 that have been guided from the inclined wall 2 of the upstream track E in a single row and single layer in the longitudinal direction, parts front/back face sensing means for determining whether the part 1 carried on the first track 4 faces up or down, for example a reflective optical sensor 5, parts turn-over means for exerting a force to turn over the part 1 located on the first track 4 according to the decision by the reflective optical sensor 5, for example an air jet device 6, and a second track 7 to which the part 1 turned over by the air jet device 6 is transferred and carried thereon. Setting angle a1 (FIG. 4) and setting angle a2 (FIG. 2) of the reflective optical sensor 5 are optimally determined in accordance to the type, size and other factors of the part to be aligned and fed.

Figure 5:
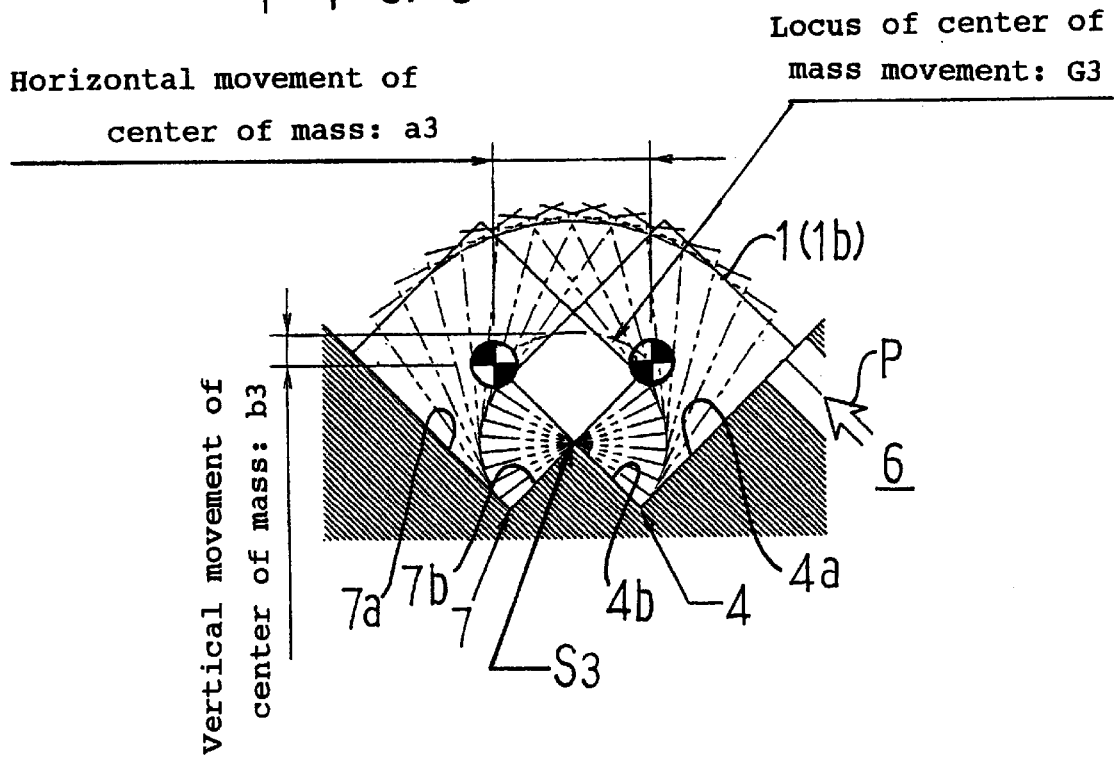
FIG. 5 is a sectional view showing the first track and the second track.

AS shown in the enlarged figure of FIG. 5, the first track 4 has a first inclined wall 4a whereon the parts 1 are carried in an inclined attitude and a second inclined wall 4b inclined in a direction opposite to the first inclined wall 4a. The first inclined wall 4a and the second inclined wall 4b intersect at an angle of 90° with each other, being inclined at an angle of 45° to the right and left from a vertical line passing through the intersect. The part 1 is guided from the inclined wall 2 of the upstream track E in an inclined attitude to the first inclined wall 4a. The second track 7 has a third inclined wall 7a where the parts 1 are carried in an inclined attitude in the direction opposite to that on the first inclined wall 4a of the first track 4 and a fourth inclined wall 7b that is inclined in the opposite direction to the third inclined wall 7a. The third inclined wall 7a and the fourth inclined wall 7b intersect with an angle of 90° with each other, being inclined at an angle of 45° to the right and left from a vertical line passing through the intersect. The second inclined wall 4b of the first track 4 and the fourth inclined wall 7b of the second track 7 share a common apex S3 (hereinafter called the common apex S3), and the entire cross section of the first track 4 and the second track 7 combined is substantially W-shaped. The common apex S3 is located below a locus G3 along which the center of mass of the part 1 moves while the part is moved from the first track 4 to the second track 7 while being turned over.

As shown in the enlarged view in FIG. 6, the air jet device 6 has such a configuration as a nozzle 6a opens in the first inclined wall 4a of the first track 4 thereby to spout compressed air at right angles to the first inclined wall 4a. Installed above the third inclined wall 7a of the second track 7 is a parts correction side plate 8.

When the part 1 that has been carried in single row and single layer in the longitudinal direction along the first inclined wall 4a of the first track 4 reaches a predetermined position, the reflective optical sensor 5 irradiates the top surface of the part 1 with sensing light. Then the reflective optical sensor 5 determines whether there is reflection of the light from the surface and, when present, measures the intensity of the reflected light thereby to determine whether the top surface of the part 1 is the front face 1a or the back face 1b. In case the top surface of the part 1 that has reached the predetermined position is the front face 1a that has low reflectivity to light, for example, the part 1 (1a) is passed as it is. When the top surface of the part 1 is the back face 1b that has high reflectivity to light, the reflective optical sensor 5 senses it and let the air jet device 6 actuate and spout compressed air P only for a short period of time, as shown in FIG. 5. As the part 1 (1b) located on the first inclined wall 4a of the first track 4 receives the pressure of the compressed air, the part is turned over onto the third inclined wall 7a of the second track 7, with the front face 1a becomes the top surface. During this process, the part 1 (1b) turns around the common apex S3 of the first inclined wall 4a of the first track 4 and the fourth inclined wall 7b of the second track 7 as a fixed support point, and is therefore capable of moving from the first track 4 to the second track 7 by making only a turn over motion along a simple arc-shaped locus. Consequently, even a part having a small width-to-thickness (D/T) ratio such as the part 1 of this embodiment can be turned over reliably, thus greatly improving the efficiency of turning over compared to the prior art. Also there may be such a case in which the part 1 that has been turned over onto the third inclined wall 7a of the second track 7 is caused to swing on the third inclined wall 7a by such an influence of the pressure of the compressed air from the air jet device 6 and the frictional force of the third inclined wall 7a, but the swing motion is restricted by the parts correction side plate 8 so that the part 1 is maintained in the normal attitude (the state with longer side aligned in the moving direction). The air jet device 6 is installed a little downstream of the position where the reflective optical sensor 5 is installed, so that the part 1 is turned over by the air jet device 6 immediately after up/down facing direction is determined by the reflective optical sensor 5. Also the operation of turning over the part 1 is carried out in the course of the carrying movement, and the movement of the part 1 in the carrying direction does not stop even during turning over. Thus the parts can be fed continuously at a high speed.

A junction A2 is disposed downstream of the parts front/back orientation correcting section A1. The junction A2 comprises a merging track 9 having an inverted trapezoidal shape as shown in FIG. 7, and has a flat bottom 9a of a width slightly greater than the width D of the part 1, and inclined walls 9b, 9c rising from the left and right edges of the bottom 9a outwardly, respectively, in a continuous structure in the direction of inclination. The merging tack 9 may have the cross section of inverted trapezoid that may be formed immediately after the parts front/back orientation correcting means A1, or may have the cross section that gradually changes from the parts front/back orientation correcting section A1 to the inverted trapezoid.

The parts 1 (1a) that have been carried with the front face 1a facing up along the first inclined wall 4a of the first track 4 and along the third inclined wall 7a of the second track 7 of the parts front/back orientation correcting section A1 are merged into a single line during the movement through the merging track 9 of the junction A2, while the attitude thereof is changed to horizontal attitude with the front face 1a facing up, and are carried over to the next process along the bottom 9a of the merging track 9.

Figure 8:
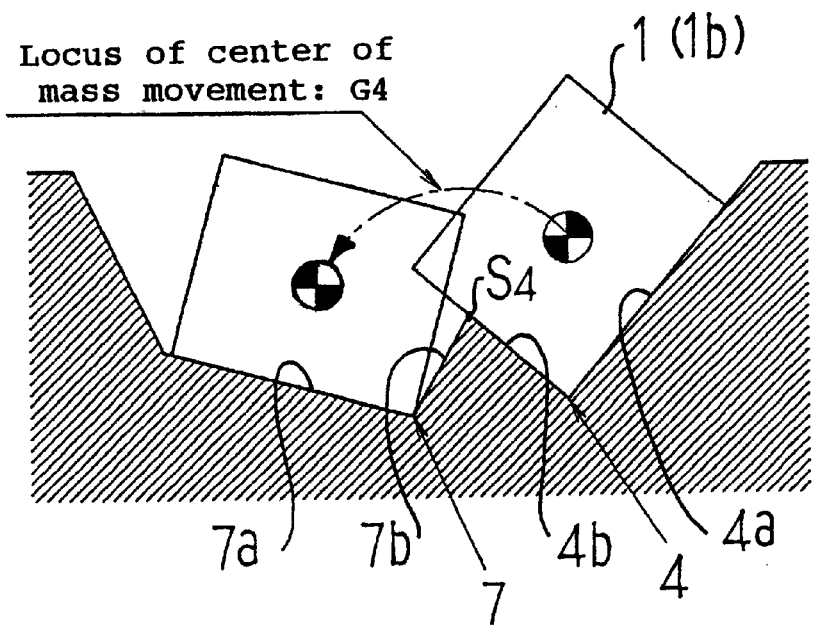
FIG. 8 is a sectional view showing a variation of the first track and the second track.
Figure 9:
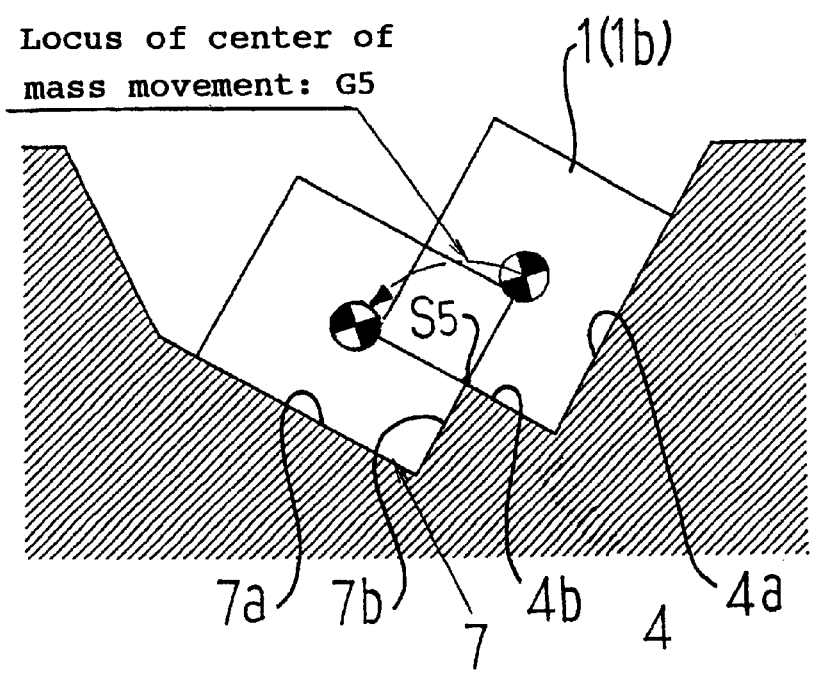
FIG. 9 is a sectional view showing a variation of the first track and the second track.

FIG. 8 and FIG. 9 show variations of the first track 4 and the second track 7 of the parts front/back orientation correcting section A1, respectively. In these variations, inclination angle of the first inclined wall 4a of the first track 4 is made steeper in order to make it easier for the parts 1 (1b) to turn over when being transferred from the first track 4 to the second track 7, and inclination angle of the third inclined wall 7a of the second track 7 is made gentler in order to ensure stable movement of the parts 1 that have been transferred to the second track 7. In the variation shown in FIG. 8, the first track 4 and the second track 7 are disposed asymmetrically, while in the variation shown in FIG. 9 the first track 4 and the second track 7 are disposed symmetrically with each other.

Figure 10:
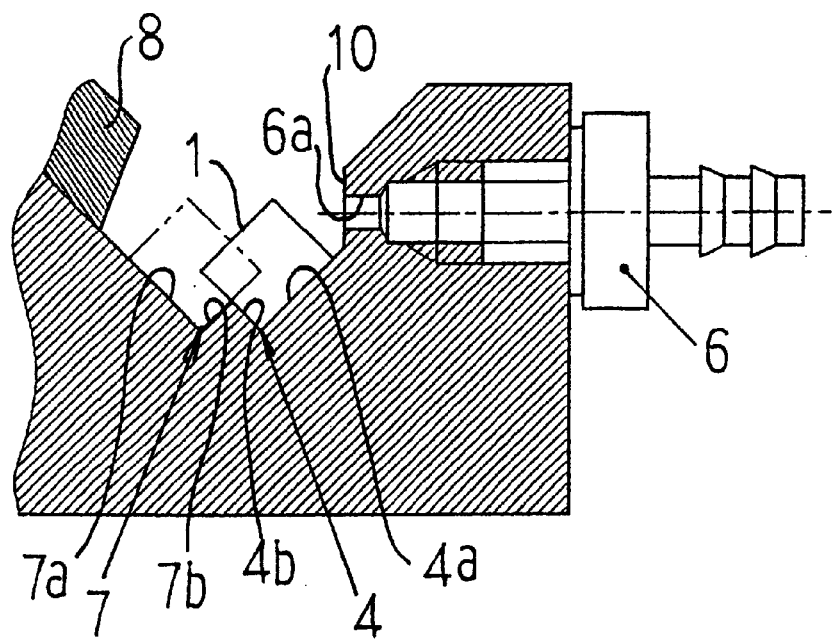
FIG. 10 is a sectional view showing a variation of the air jet device.
Figure 11:
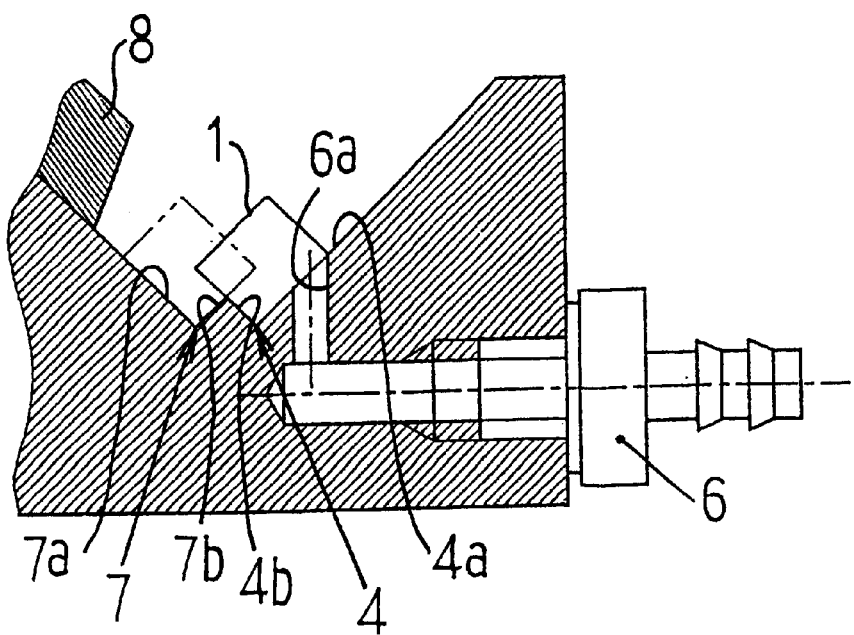
FIG. 11 is a sectional view showing a variation of the air jet device.

FIG. 10 and FIG. 11 show variations of the air jet device 6 of the parts front/back orientation correcting section A1. In the variation shown in FIG. 10, the nozzle 6a of the air jet device 6 opens in a vertical wall 10 that rises continuously from the first inclined wall 4a of the first track 4, so as to spout the compressed air in the horizontal direction. In the variation shown in FIG. 11, the nozzle 6a of the air jet device 6 opens in the first inclined wall 4a of the first track 4, to spout the compressed air in the vertical direction.

FIG. 12 through FIG. 15 show variations of the parts correction side plate 8 of the parts front/back orientation correcting section A1.

Figure 12:
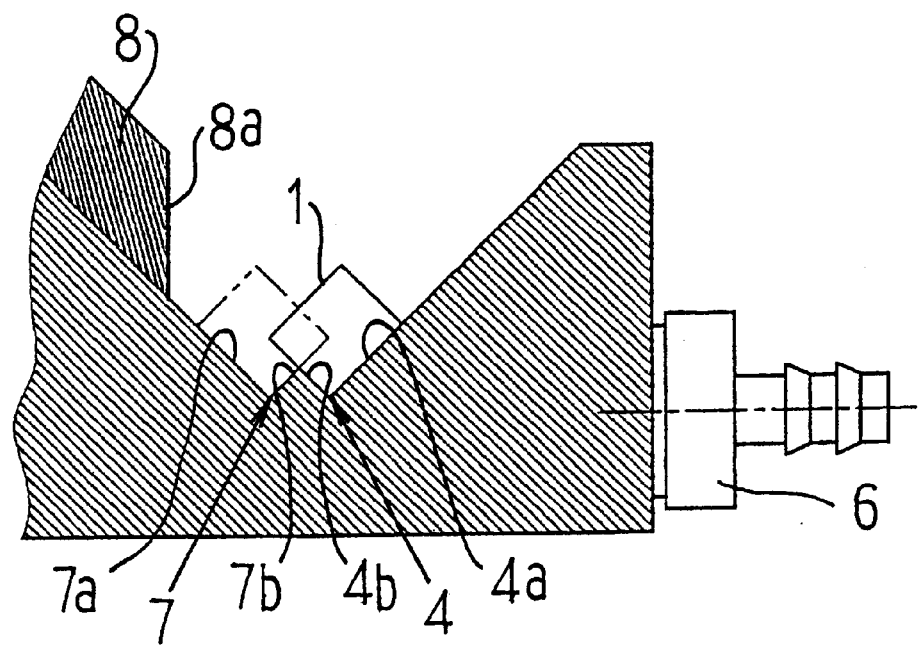
FIG. 12 is a sectional view showing a variation of the parts correction side plate.

In the variation shown in FIG. 12, the wall surface 8a of the parts correction side plate 8 is arranged to rise vertically.

Figure 13:
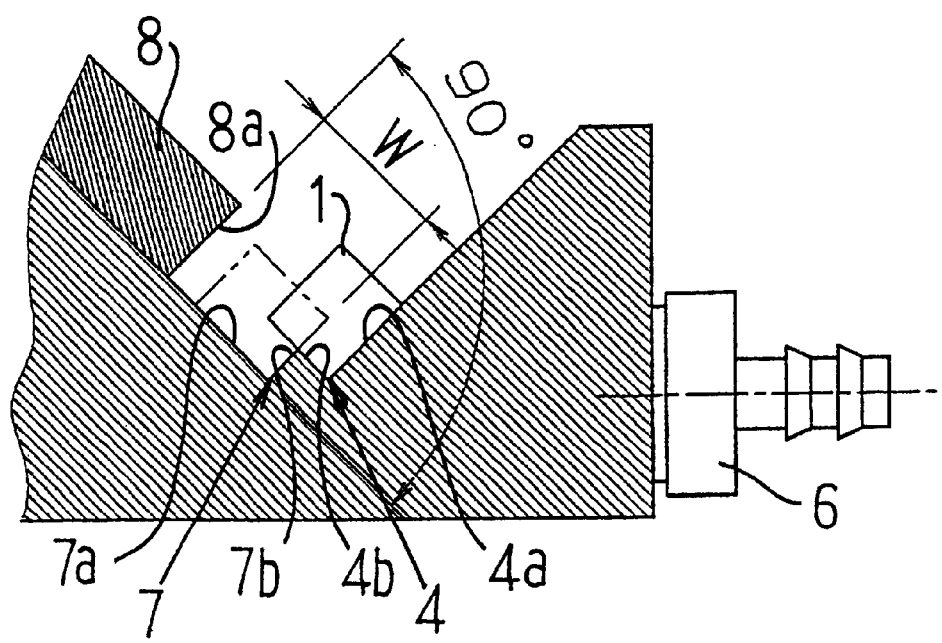
FIG. 13 is a sectional view showing a variation of the parts correction side plate.

In the variation shown in FIG. 13, the wall surface 8a of the parts correction side plate 8 is disposed at right angles to the third inclined wall 7a of the second track 7. This configuration is advantageous when aligning and feeding such part 1 that has a large mass and a large length (L). Since the wall surface 8a of the parts correction side plate 8 becomes parallel to the side face of the part 1 that has been turned over onto the third inclined wall 7a, the part 1 that has been turned over can be held accurately. The distance W between the fourth inclined wall 7b of the second track 7 and the wall surface 8a of the parts correction side plate 8 is a little larger than the width D of the part 1 and less than the length L.

Figure 14:
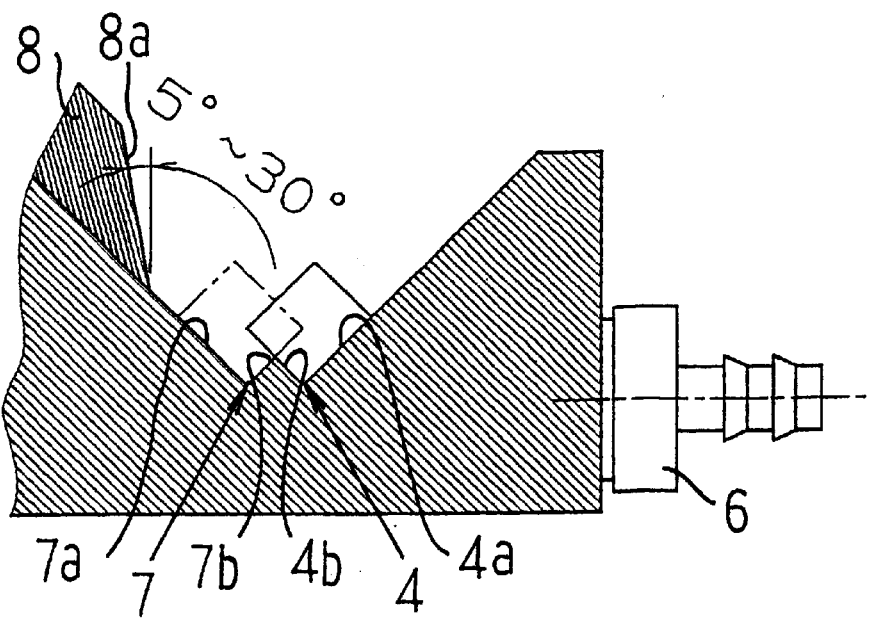
FIG. 14 is a sectional view showing a variation of the parts correction side plate.

In the variation shown in FIG. 14, the wall surface 8a of the parts correction side plate 8 is inclined by an angle in a range from 5 to 30° from the vertical direction outwardly. This configuration is advantageous when aligning and feeding the part 1 that has a small mass and a large length (L). The part 1 that has not been properly turned over onto the third inclined wall 7a is corrected to the normal attitude by the wall surface 8a.

Figure 15:
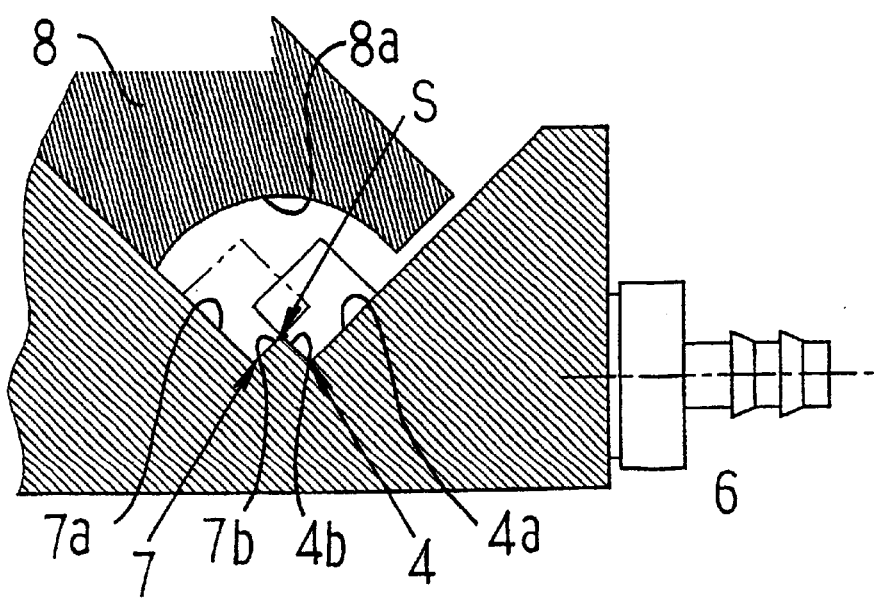
FIG. 15 is a sectional view showing a variation of the parts correction side plate.

In the variation shown in FIG. 15, the wall surface 8a of the parts correction side plate 8 is formed in an arc having a size of the maximum locus of the movement of the part 1 or larger, with a center located at the support point S around which the part 1 turns over. The part 1 can be smoothly turned over along the wall surface 8a as the guide.

FIG. 16 through FIG. 20 show variations of the merging track 9 of the junction A2.

Figure 16:
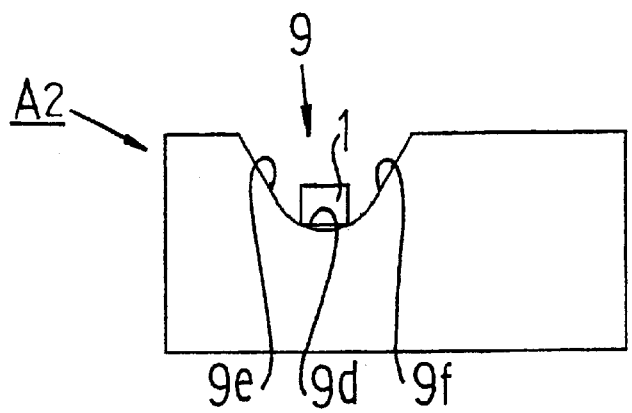
FIG. 16 is a sectional view showing a variation of the merging track.

In the variation shown in FIG. 16, the merging track 9 is formed in a substantially U shape. The merging track 9 in this variation comprises an arc-shaped bottom 9d and inclined walls 9e, 9f rising from the left and right edges of the bottom 9d outwardly, respectively, in a continuous structure in the direction of inclination. Diameter of the arc of the bottom 9d is larger than the width D of the part 1. While a part having a small width to thickness (D/T) ratio is likely to rise sideways, the part 1 is made temporarily unstable with the arc-shaped bottom 9d (resting on the bottom 9d at two points) to become likely to tumble, thereby correcting the part that rises sideways to the normal attitude.

Figure 17:
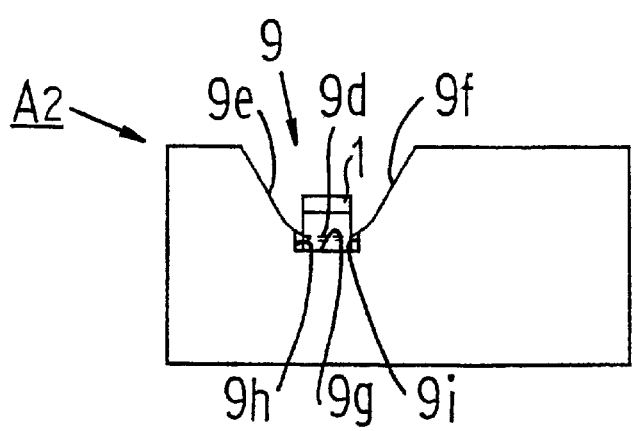
FIG. 17 is a sectional view showing a variation of the merging track.

In the variation shown in FIG. 17, upstream portion of the merging track 9 is formed in a substantially U shape similarly to the variation shown in FIG. 16, and the downstream portion is made in square configuration. The downstream portion of the merging track 9 comprises a flat bottom 9g having a width a little larger than the width D of the part 1 and vertical walls 9h, 9i rising continuously from the left and right edges of the flat bottom 9g, respectively. Parts that have been tumbled in the upstream portion and corrected to the normal attitude are put into surface contact with the flat bottom 9g in the downstream and fed to the next process in stable condition, while lateral dislocation is reduced by the vertical walls 9h, 9i.

Figure 18:
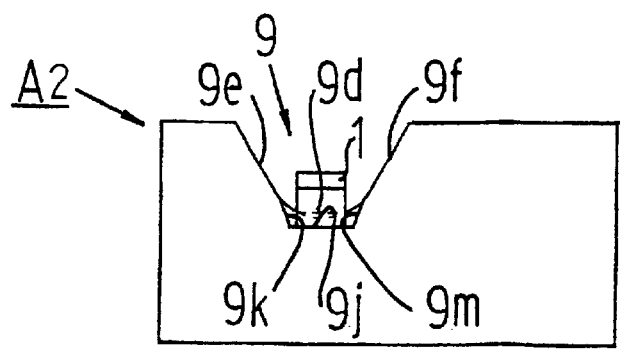
FIG. 18 is a sectional view showing a variation of the merging track.

In the variation shown in FIG. 18, the upstream portion of the merging track 9 is formed in a substantially U shape similarly to the variation shown in FIG. 16, with the downstream portion formed in an inverted trapezoidal shape. The downstream portion of the merging track 9 comprises a flat bottom 9j having a width a little larger than the width D of the part 1 and inclined walls 9k, 9m rising continuously from the left and right edges of the bottom 9j outwardly, respectively. Parts that have tumbled in an upstream portion and corrected to the normal attitude are carried smoothly to the downstream, put into surface contact with the flat bottom 9j in the downstream and fed to the next process in stable condition, while lateral dislocation is reduced by the inclined walls 9k, 9m.

Figure 19:
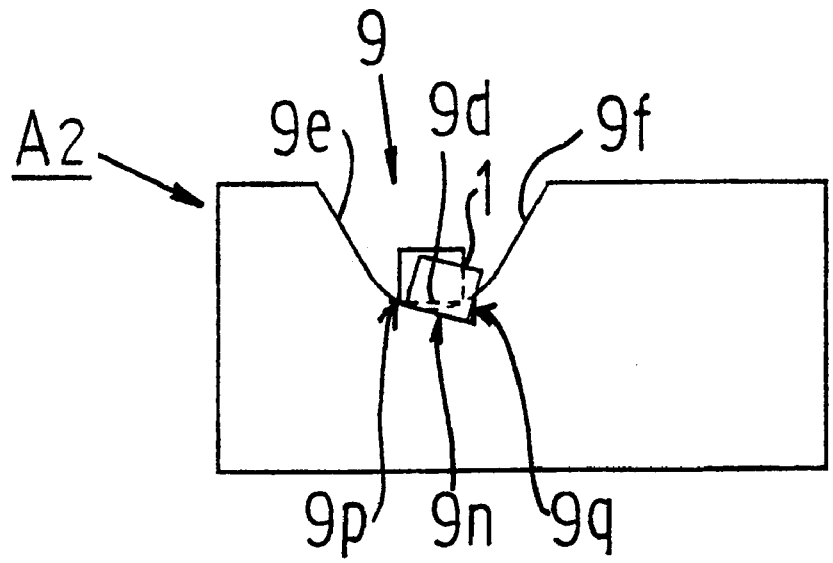
FIG. 19 is a sectional view showing a variation of the merging track.

In the variation shown in FIG. 19, the upstream portion of the merging track 9 is formed in a substantially U shape similarly to the variation shown in FIG. 16, with the downstream portion formed in an inclined shape. The downstream portion of the merging track 9 comprises an inclined bottom 9n having a width a little larger than the width D of the part 1 and is inclined by an angle substantially equal to the inclination angle of the carrying surface of the next process, for example, and vertical walls 9p, 9q rising continuously from the left and right edges of the bottom 9n, respectively. Parts that have tumbled in an upstream portion and corrected to the normal attitude are put into surface contact with the inclined bottom 9n in the downstream to be carried in a stable condition and fed to the next process in an inclined attitude smoothly, while lateral dislocation is reduced by the vertical walls 9p, 9q.

Figure 20:
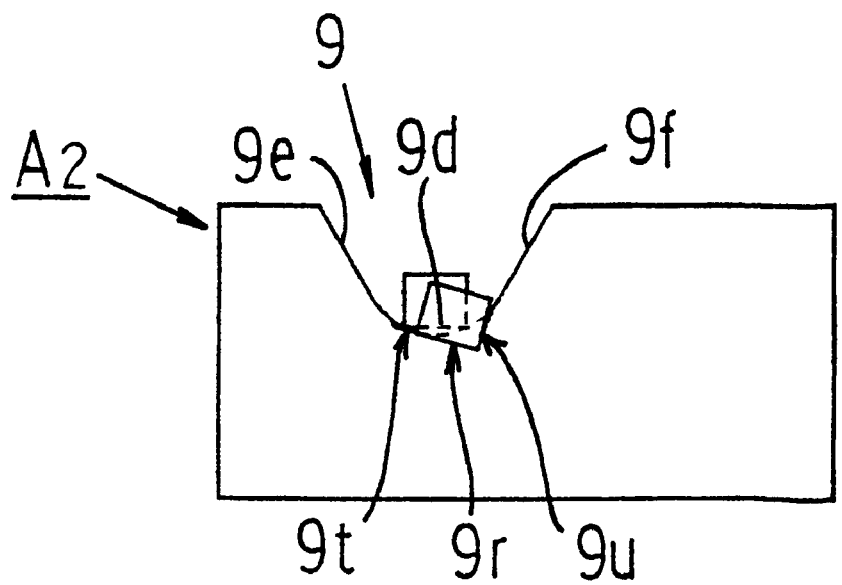
FIG. 20 is a sectional view showing a variation of the merging track.

In the variation shown in FIG. 20, the upstream portion of the merging track 9 is formed in a substantially U shape similarly to the variation shown in FIG. 16, with the downstream portion formed in an inclined shape. The downstream portion of the merging track 9 comprises an inclined bottom 9r having a width a little larger than the width D of the part 1 and is inclined by an angle substantially equal to the inclination angle of the carrying surface of the next process, for example, and walls 9t, 9u rising continuously from the left and right edges of the bottom 9r to incline outwardly, respectively. Parts that have tumbled in an upstream portion and corrected to the normal attitude are put into surface contact with the inclined bottom 9r in the downstream to be carried in a stable condition and fed to the next process in an inclined attitude smoothly, while lateral dislocation is reduced by the walls 9t, 9u.

Figure 21:
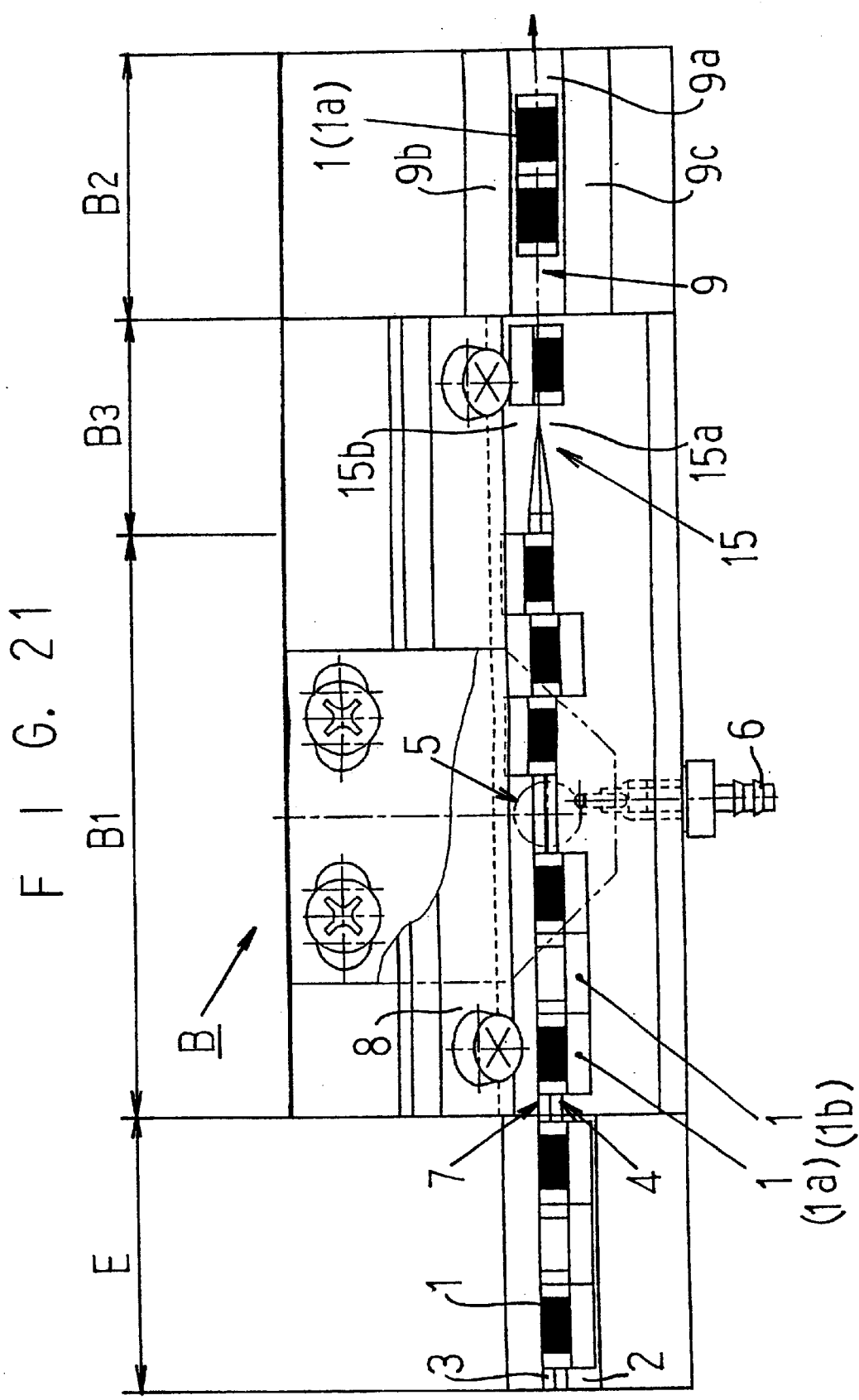
FIG. 21 is a plan view showing the overall configuration of the parts front and back face aligning apparatus A according to the second embodiment.
Figure 22:
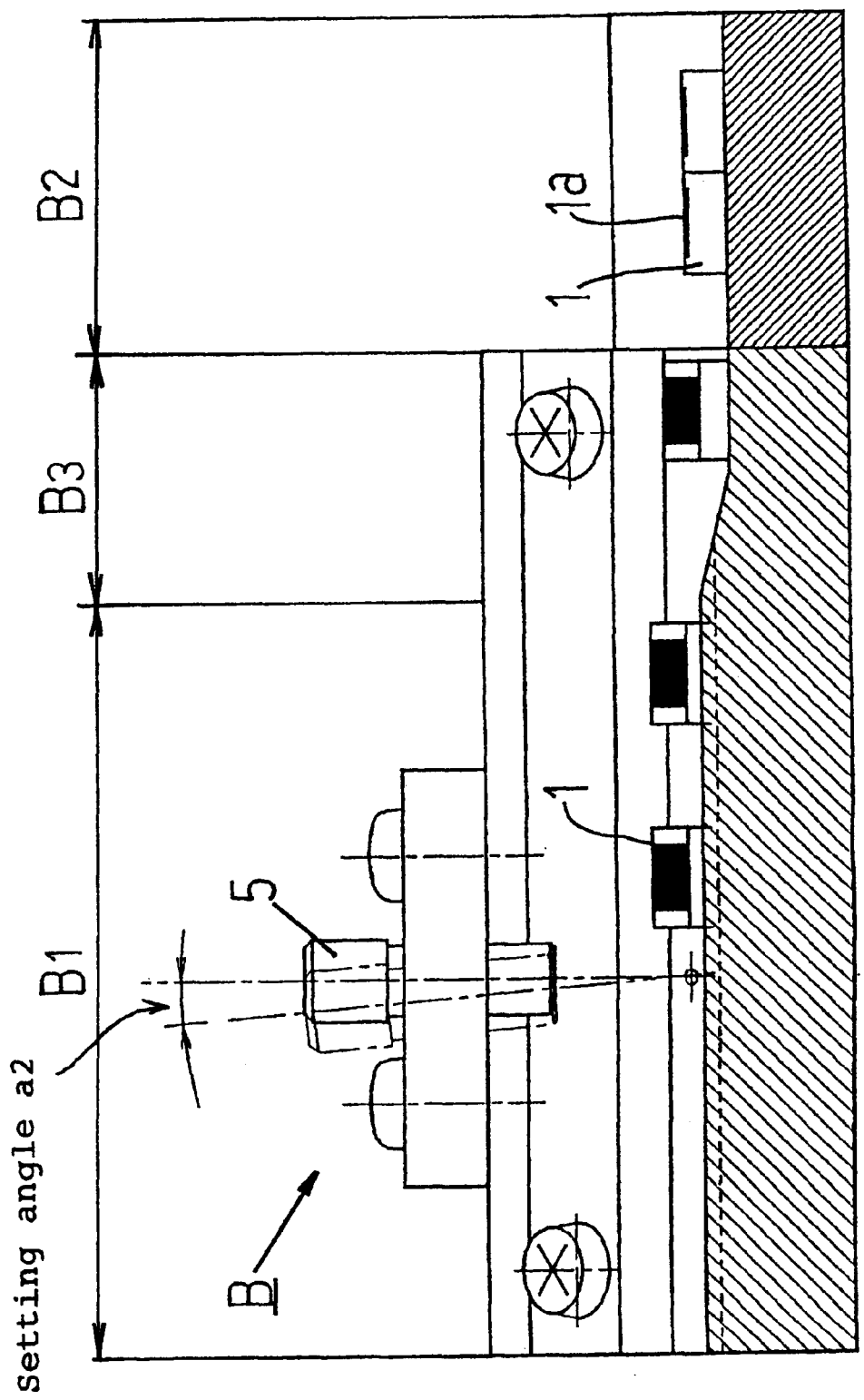
FIG. 22 is a side view (partially cutaway) showing the overall configuration of the parts front and back face aligning apparatus B according to the second embodiment.

FIG. 21 and FIG. 22 show the overall configuration of the parts front and back face aligning apparatus B according to the second embodiment. Members and portions substantially the same as those in the first embodiment will be referred to by identical reference numerals, and description that is the same as that of the above will be omitted.

The parts front and back face aligning apparatus B is disposed in a parts carrying path of a straight feeder or in a parts carrying path of a bowl feeder, and comprises a parts front/back orientation correcting section B1 located upstream, a junction B2 located L downstream and a merging section B3 disposed between the parts front/back orientation correcting section B1 and the junction B2 (the overall shape may be curved in an arc shape when disposed on a bowl feeder). Parts 1 are guided from the upstream track E into the parts front/back orientation correcting section B1 in a single row and single layer under the condition of being aligned in the longitudinal direction.

The parts front/back face correcting means B of this embodiment is difference from that of the first embodiment in that the merging section B3 is provided between the parts front/back orientation correcting section B1 and the junction B2. As shown in FIG. 23, the merging section B3 comprises one V-shaped merging track 15 of which cross section gradually changes from the substantially W-shaped tracks (the first track 4 and the second track 7) shown in FIG. 5, for example, and has an inclined wall 15a that has an inclination angle nearly equal to that of the first inclined wall 4a of the first track 4 of the parts front/back orientation correcting section B1 and an inclined wall 15b that has an inclination angle nearly equal to that of the third inclined wall 7a of the second track 7 of the parts front/back orientation correcting section B1. The part 1 that has been carried along the first inclined wall 4a of the first track 4 is transferred smoothly onto the inclined wall 15a of the merging track 15, and the part 1 that has been carried along the third inclined wall 7a of the second track 7 is transferred smoothly onto the inclined wall 15b of the merging track 15, thereby to be carried toward the junction B2 downstream. Thus as the part 1 on the first track 4 and the part 1 on the second track 7 are put into one line by the merging section B3, merging of the parts at the junction B2 is carried out more smoothly.

Figure 24:
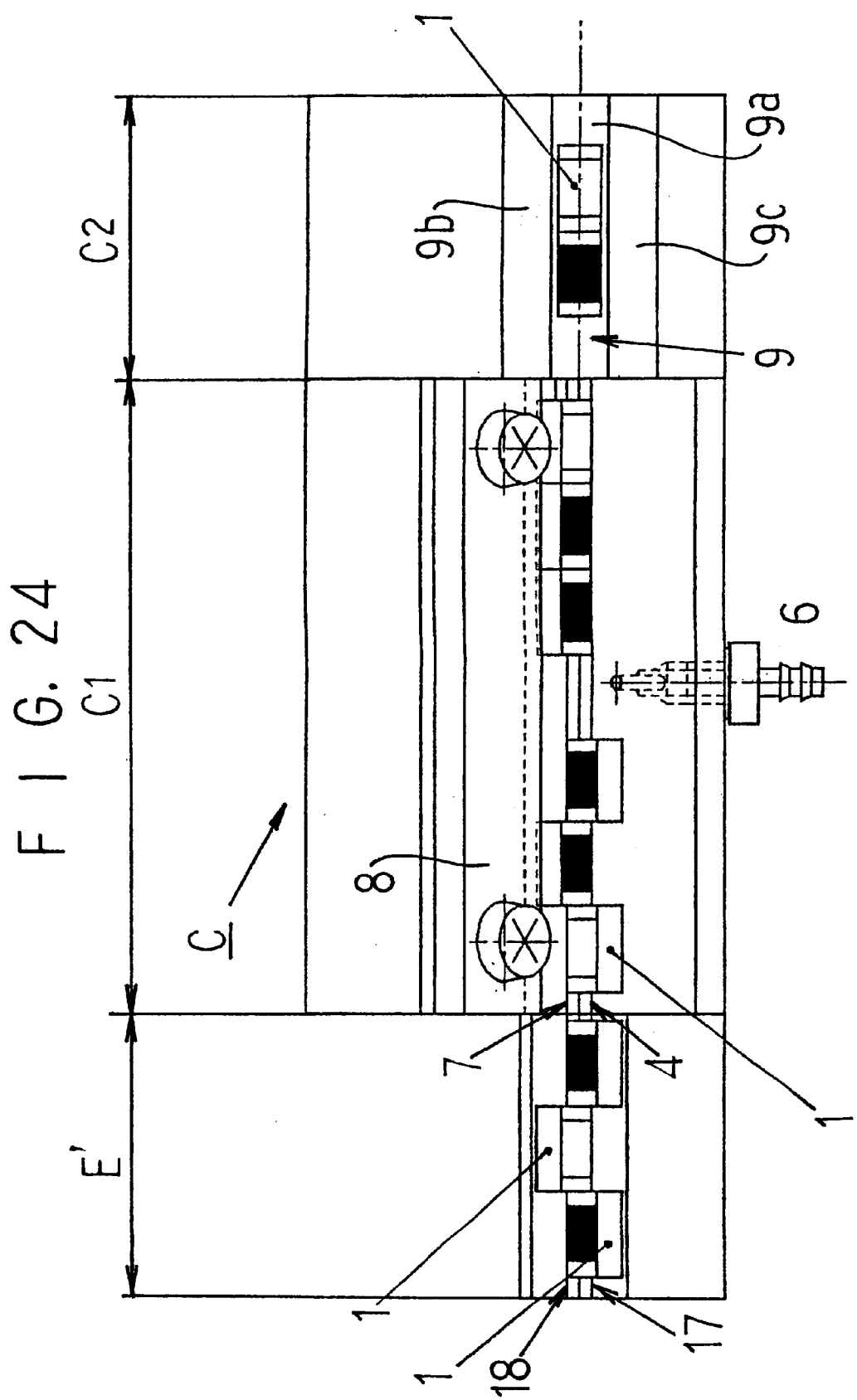
FIG. 24 is a plan view showing the overall configuration of the parts turn-over device C according to the third embodiment.
Figure 25:
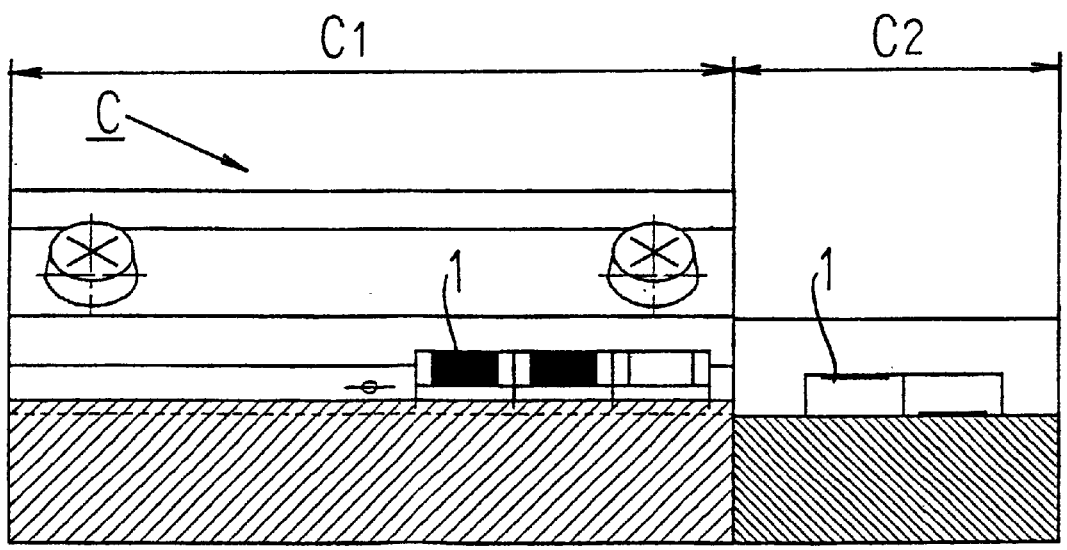
FIG. 25 is a side view (partially cutaway) showing the overall configuration of the parts front and back face aligning apparatus B according to the second embodiment.

FIG. 24 and FIG. 25 show the overall configuration of the parts turn-over device C according to the third embodiment. The parts turn-over device C is provided for the purpose of turning over all the parts located on a specified track with the turn over device without checking the up/down facing orientation, in case the parts need not to be aligned in the up-down facing orientation, or it is not necessary to align all the parts in the up-down facing orientation for such a reason as hat the number of parts to be fed to the next process is small although the parts would be aligned in the up-down facing orientation in the last, or there is imbalance between the probabilities of the parts to face up and face down due to the characteristics of the parts, The parts turn-over device C may be used, for example, as preprocessing means located upstream of the parts front and back face aligning apparatus A or the parts front and back face aligning apparatus B of the embodiments described above.

Figure 27:
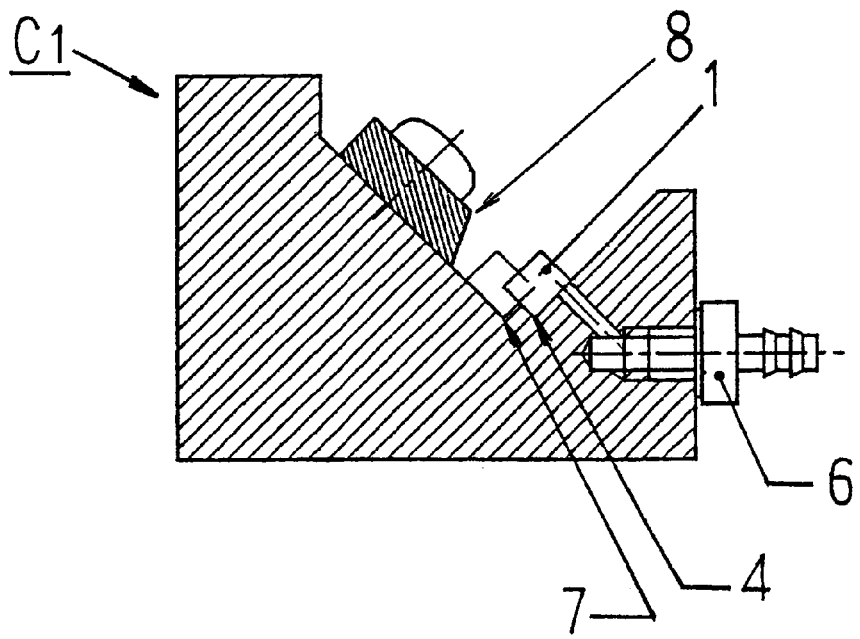
FIG. 27 is a sectional view showing the parts turn-over section C1.

The parts turn-over device C is disposed in a parts carrying path of a straight feeder or in a parts carrying path of a bowl feeder, and comprises a parts turn-over section C1 located upstream and a junction C2 located downstream (the overall shape may be curved in an arc shape when disposed on a bowl feeder). The parts turn-over section C1 is the same as the parts front/back orientation correcting means A1 of the embodiments described above, except that the parts front/back face sensing means is not provided (refer to FIG. 27), and the junction C2 is the same as the junction A2 of the embodiments described above. Thus since the basic configuration of the parts turn-over device C has much in common with the embodiments described above, members and portions that are substantially the same as those in the embodiments described above will be referred to by identical reference numerals, and description that is the same as that of the above will be omitted.

Figure 26:
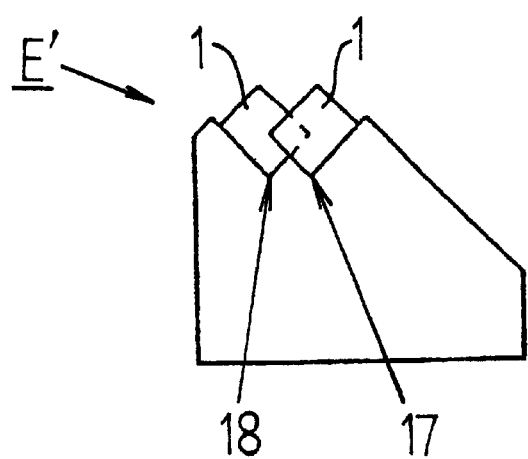
FIG. 26 shows the upstream track E' viewed from the upstream.

Parts 1 are guided from an upstream track E' into the parts turn-over section C1 in a single layer under the condition of being aligned in the longitudinal direction. As shown in FIG. 26, the upstream track E' has a track 17, having substantially the same configuration as the first track 4 of the parts turn-over section C1, and a track 18 having substantially the same configuration as the first track 7 of the parts turn-over section C1. The parts 1 are distributed by preprocessing means, which is not shown, randomly onto the track 17 and the track 18. The parts 1 on the track 17 are smoothly guided onto the first inclined wall 4a of the first track 4, and the parts 1 on the track 18 are smoothly guided onto the third inclined wall 7a of the second track 7.

In the parts turn-over section C1, the air jet device 6 constantly spouts compressed air so that, although the parts 1 on the third inclined wall 7a of the second track 7 are carried downstream as they are, the parts on the first inclined wall 4a of the first track 4 are all turned over by the compressed air constantly spouted from the air jet device 6 and are transferred onto the third inclined wall 7a of the second track 7. Thus all of the parts 1 are aligned on the third inclined wall 7a of the second track 7, carried to the junction C2 located downstream, and changed to horizontal attitude in the junction C2.

Figure 28:
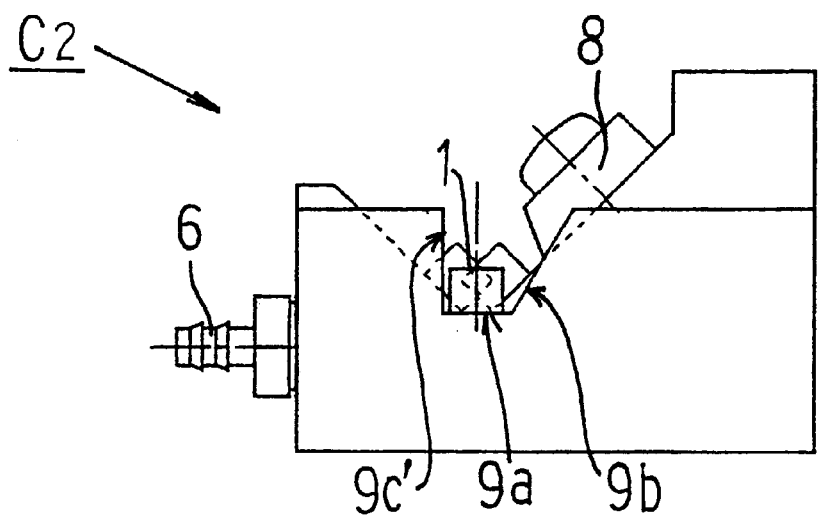
FIG. 28 shows the junction C2 viewed from the downstream.

Since all the parts 1 are transferred from the third inclined wall 7a of the second track 7 to the junction C2, wall surface 9c' on the first track 4 side of the merging track 9 may be arranged vertically as shown in FIG. 28. With this configuration, too, all the parts 1 can be changed to horizontal attitude, and lateral dislocation of the parts 1 can be reduced by making one wall surface 9c' rise vertically.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A parts front and back face aligning apparatus for a vibratory parts feeding machine comprising a parts front/back orientation correcting section, the parts front/back orientation correcting section comprising:

a first track for carrying a plurality of parts guided from a track located upstream in single row and single layer, each part having a front face and a back face, one of the front and back faces of each part becoming a top surface over the first track;

a parts front/back face sensing means for determining whether the top surface of the part carried on the first track to a predetermined position is either one of the front face or the back face;

a turn-over means that exerts a force to turn over the part on the first track according to a determination of the parts front/back face sensing means, and a second track to which the part turned over by the parts turn-over means is transferred and carried thereon, the top surface of the part carried on the second track being reversed relative to the top surface of the part carried on the first track due to the turn-over motion of the p art.

2. The apparatus according to claim 1, wherein the first track and the second track extend adjacent each other through a border portion therebetween.

3. The apparatus according to claim 2, wherein the turn-over motion of the part is carried out around a point on the border portion.

4. The apparatus according to claim 3, wherein the point around which the turn-over motion of the part is carried out is fixed.

5. The apparatus according to claim 1, 2, 3 or 4, wherein the first track has a first inclined wall for carrying the plurality of parts in an inclined attitude and a second inclined wall inclined in a direction opposite to the first inclined wall, the second track having a third inclined wall for carrying the parts transferred from the first track in an attitude inclined in a direction opposite to the attitude of the first inclined wall, and a fourth inclined wall inclined to a direction opposite to the third inclined wall.

6. The apparatus according to claim 5, wherein the second inclined wall of the first track and the fourth inclined wall of the second track have a common apex.

7. The apparatus according to claim 6, wherein the common apex is located below a locus along which a center of mass of the part moves during the turn-over motion of the part.

8. The apparatus according to claim 1, further comprising a junction located downstream of the parts front/back orientation correcting section, where the plurality of parts carried on the first track and the plurality of parts carried on the second track are joined in a common attitude.

9. The apparatus according to claim 8, wherein a merging section is disposed between the parts front/back orientation correcting section and the junction, so that the plurality of parts carried on the first track and the plurality of parts carried on the second track are joined onto one track.

10. A parts turn-over device for a vibratory parts feeding machine comprising a parts turnover section, the parts turn-over section comprising:

a first track for carrying a plurality of parts in single row and single layer, each part having a front face and a back face, one of the front and back faces of each part becoming a top surface over the first track;

a second track for carrying a plurality of parts in single row and single layer; and a turn-over means for exerting a force to turn over the part on the first track, thereby transferring the turned-over part from the first track onto the second track, wherein a top surface of the turn-over part on the second track is reversed relative to the top surface of the turned-over part while on the first track.

11. The device according to claim 10, wherein the first track and the second track extend adjacent each other through a border portion therebetween.

12. The device according to claim 11, wherein the turn-over motion of the part is carried out around a point on the border portion.

13. The device according to claim 12, wherein the point around which the turn-over motion of the part is carried out is fixed.

14. The device according to claim 10, 11, 12 or 13, wherein the first track has a first inclined wall for carrying the parts in an inclined attitude and a second inclined wall inclined in a direction opposite to the first inclined wall, the second track has a third inclined wall for carrying the parts transferred from the first track in an attitude inclined in a direction opposite to the attitude of the first inclined wall and a fourth inclined wall inclined to a direction opposite to the third inclined wall.

15. The device according to claim 14, wherein the second inclined wall of the first track and the fourth inclined wall of the second track have a common apex.

16. The device according to claim 15, wherein the common apex is located below a locus along which a center of mass of the part moves during the turn-over motion of the part.

* * * * *